United States Patent [19]

Ihara

[11] Patent Number: 5,030,859
[45] Date of Patent: Jul. 9, 1991

[54] DRIVE DEVICE FOR A CMOS SENSE AMPLIFIER IN A DYNAMIC SEMICONDUCTOR MEMORY DEVICE

[75] Inventor: Makoto Ihara, Tenri, Japan

[73] Assignee: Sharp Kabushiki Kaisha, Osaka, Japan

[21] Appl. No.: 454,443

[22] Filed: Dec. 21, 1989

[30] Foreign Application Priority Data

Dec. 27, 1988 [JP] Japan .............................. 63-332263

[51] Int. Cl.$^5$ ..................... G11C 13/00; H03K 3/356
[52] U.S. Cl. ................................... 307/530; 307/279; 365/206
[58] Field of Search ............... 307/530, 353, 352, 355, 307/279, 585, 443, 480, 481; 365/208, 205, 203, 207

[56] References Cited

U.S. PATENT DOCUMENTS 4,858,193  8/1989  Furutami et al. ................... 307/530
4,943,738  7/1990  Hoshi ................................. 307/279

Primary Examiner—Timothy P. Callahan

[57] ABSTRACT

A drive device for a CMOS sense amplifier in a dynamic semiconductor memory includes a capacitor, a first switch circuit for making a connection between a power supply line, a first terminal of the capacitor and a pull-up transistor drive terminal of the sense amplifier in accordance with an input signal, and a second switch circuit for making a connection between a ground line, a second terminal of the capacitor and a pull-down transistor drive terminal of the sense amplifier in accordance with an input signal. Before driving the CMOS sense amplifier, the first and second terminals of the capacitor are connected to the power supply line and the ground line by the first and second switch circuits, respectively. Then, the first and second terminals of the capacitor are connected to the pull-up and pull-down transistor drive terminals by the respective switch circuits so that the sense amplifier is driven by the potential difference of both terminals of the charged capacitor. Thereafter, the pull-up and pull-down transistor drive terminals of the sense amplifier are connected to the power supply line and the ground line by the respective switch circuits so as to be restored. As a result, common mode noise is prevented from being generated when a plurality of CMOS sense amplifiers are driven at the same time so that the reliability of the dynamic semiconductor memory is improved.

3 Claims, 3 Drawing Sheets

DRIVE DEVICE FOR A CMOS SENSE AMPLIFIER IN A DYNAMIC SEMICONDUCTOR MEMORY DEVICE

BACKGROUND OF THE INVENTION

The present invention relates to a dynamic semiconductor memory device having a complementary metal oxide semiconductor sense amplifier (referred to as a CMOS sense amplifier hereinafter), and more particularly to a drive device for the CMOS sense amplifier which can drive the CMOS sense amplifier without causing fluctuations in the ground potential and power supply potential.

FIG. 3 is a block diagram schematically illustrating a CMOS sense amplifier of a conventional dynamic semiconductor memory device and a drive device therefor. As illustrated in FIG. 3, a P-channel MIS (metal insulator semiconductor) FET drive line 41 connected to the CMOS sense amplifier 33 is connected through a switching element 31 to a power supply line 21 having the same electrical potential as the power supply terminal, and a N-channel MIS FET drive line 42 is connected through a switching element 32 to a ground line 22 having the same electrical potential as the ground terminal. The P-channel MIS FET (not shown) in the CMOS sense amplifier 33 is driven by closing the switching element 31 so that continuity exists, and the N-channel MIS FET (not shown) in the CMOS sense amplifier 33 is driven by closing the switching element 32 so that continuity exists.

When the above described conventional dynamic semiconductor memory device has multiple CMOS sense amplifiers 33 and all sense amplifiers 33 are simultaneously driven by their respective drive devices of the above described structure, the following problem is presented. That is, when the CMOS sense amplifiers 33 are simultaneously driven, a comparatively large current with respect to the current capacity of the power supply line 21 and the ground line 22 flows. Then the power supply potential and the ground potential fluctuate, and common mode noise which lowers reliability of the dynamic memory device is generated in the vicinity.

SUMMARY OF THE INVENTION

Therefore, the principal object of the present invention is to provide a drive device for a CMOS sense amplifier having a pull-up transistor and a pull-down transistor in a dynamic semiconductor memory device, which prevents the fluctuation of the power supply potential and the ground potential even when a plurality of CMOS sense amplifiers are simultaneously driven. As a result, common mode noise is prevented from being generated when the CMOS sense amplifiers are driven at the same time, and the reliability of the memory device is improved.

In order to accomplish the above object, a drive device for a CMOS sense amplifier of a dynamic semiconductor memory device of the present invention has a capacitor having first and second terminals; a first switch circuit for making connections between a power supply line, the first terminal of the capacitor and a pull-up transistor drive terminal of the CMOS sense amplifier in accordance with an input signal; and a second switch circuit for making a connection between a ground line, the second terminal of the capacitor and a pull-down transistor drive terminal of the CMOS sense amplifier in accordance with an input signal. Accordingly the CMOS sense amplifier is driven by a potential difference between the first and second terminals of the charged capacitor.

FIG. 1 is a block diagram illustrating the present invention. For convenience, the components of the drive device of the present invention are designated by respective reference numerals which are also used for explaining a preferred embodiment of the present invention. The operation of the drive device of the present invention is described with reference to FIG. 1.

When the CMOS sense amplifier 3 is not operated, the first and second switch circuits 1 and 2 are controlled so that no connection is made between the pull-up transistor drive terminal of the CMOS sense amplifier and a power supply line 11 connected to the power supply and between the pull-down transistor drive terminal and a ground line 12 connected to the ground. Thereby, a connection is made between the power supply line 11 and the first terminal 61 of the capacitor 4 and between the ground line 12 and the second terminal 62 of the capacitor 4 for charging the capacitor 4.

When the CMOS sense amplifier 3 is to be operated, the first and second switch circuits 1 and 2 are controlled so that no connection is made between the power supply line 11 and the pull-up transistor drive terminal and between the ground line 12 and the pull-down transistor terminal. Thereby, a connection is made between the pull-up transistor drive terminal and the first terminal 61 of the capacitor 4 and between the pull-down transistor drive terminal and the second terminal 62 of the capacitor 4. This creates a potential difference between the first and second terminals 61 and 62 of the capacitor 4 which is used to drive the CMOS sense amplifier 3. Because the CMOS sense amplifier 3, the power supply line 11 and the ground line 12 are electrically separated by the first and second switch circuits 1 and 2, the potential of the ground line 12 and the power supply line 11 is not affected. As a result, common mode noise is not generated when the CMOS sense amplifier 3 is driven and common mode noise is reduced as a whole.

After the drive operation is completed, the first and second switch circuits 1 and 2 are again controlled so that there is no continuity to the first and second terminals 61 and 62 of the capacitor 4. Thereby the pull-up transistor drive terminal is connected to the power supply line 11 and the pull-down transistor drive terminal is connected to the ground line 12. In this way, a sense amplification cycle is completed.

The first and second terminals of the capacitor may be connected to a line having a desired high potential other than the potential of the power supply and a line having a desired low potential other than the ground potential, respectively.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF A PREFERRED EMBODIMENT

Figure 1:
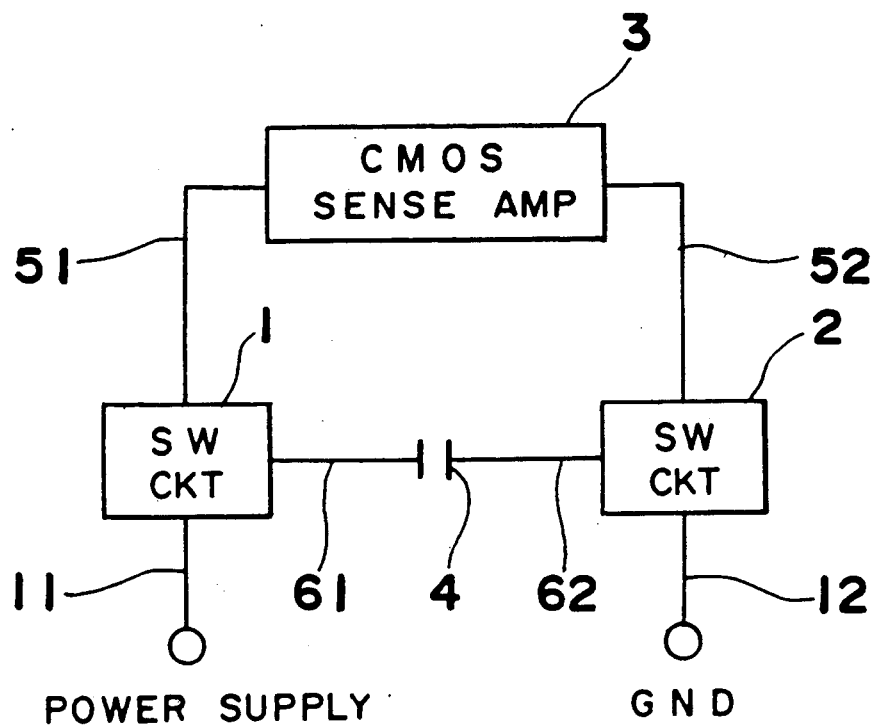
FIG. 1 is a block diagram illustrating an embodiment of the present invention.
Figure 3:
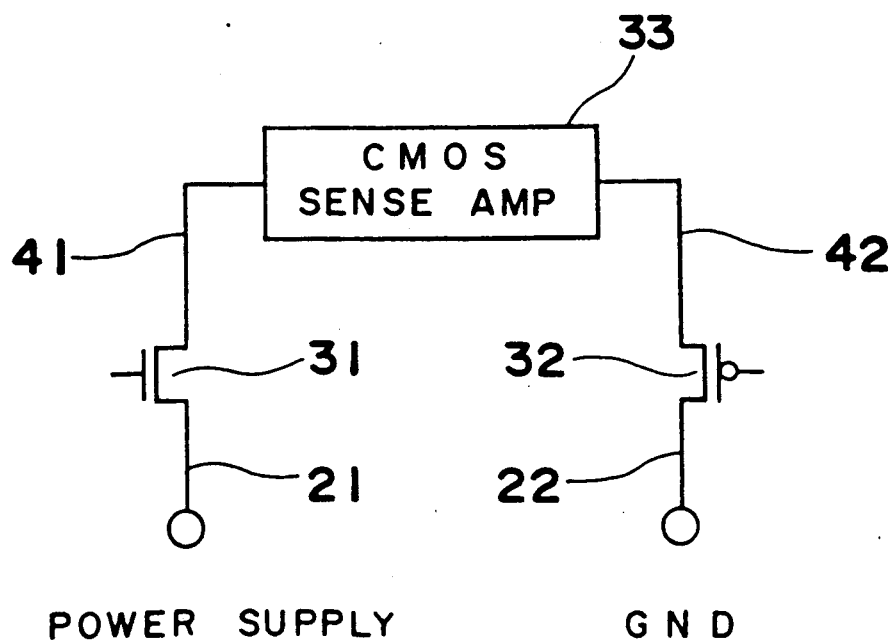
FIG. 3 is a block diagram of the conventional drive device for a CMOS sense amplifier.
Figure 2:
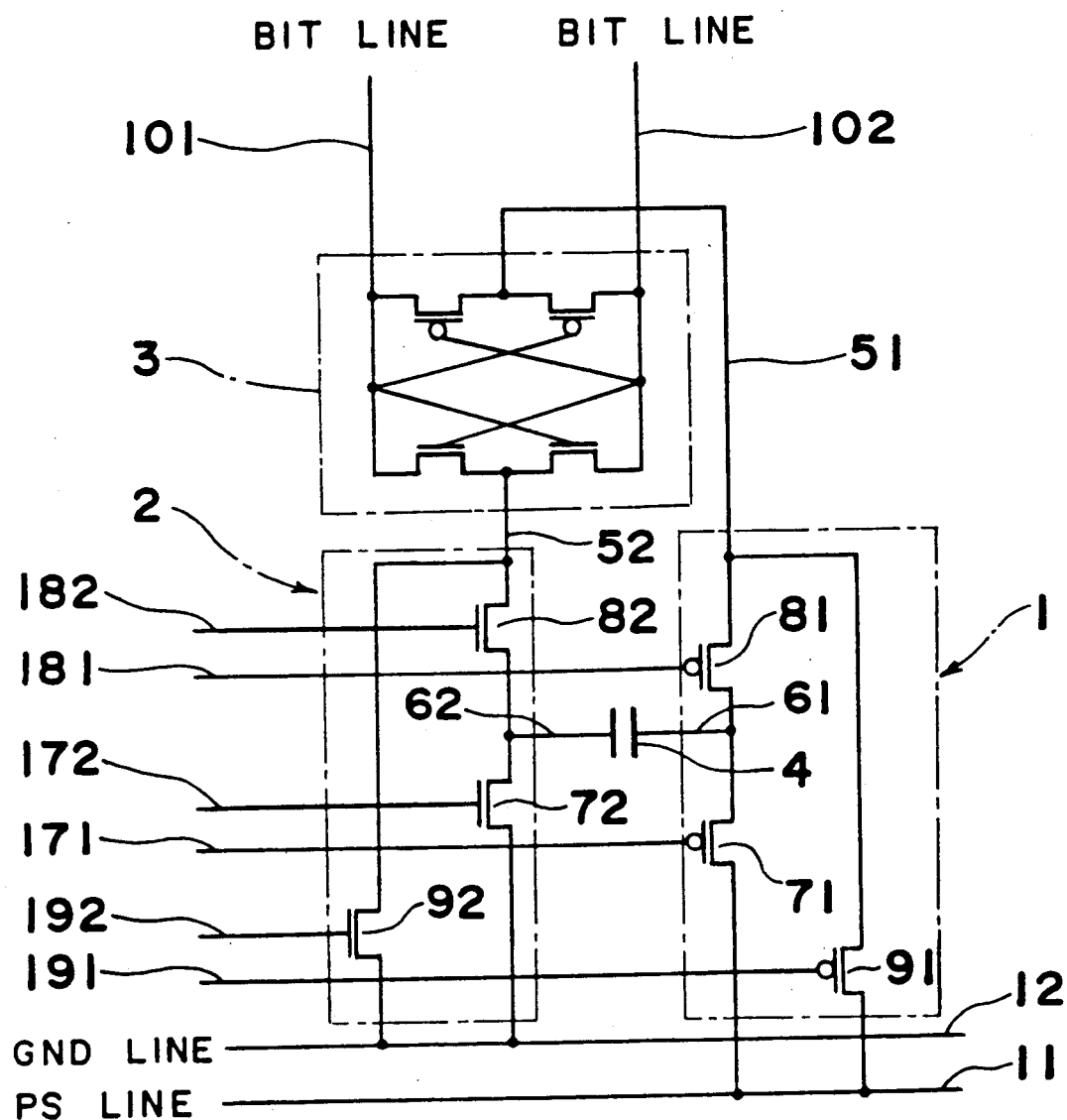
FIG. 2 is a circuit diagram of the CMOS sense amplifier drive device in another embodiment of the present invention.

FIG. 2 is a circuit diagram illustrating a sense amplifier drive circuit as an embodiment of the present invention for driving a CMOS sense amplifier 3 which has a pull-up transistor and a pull-down transistor. The CMOS sense amplifier 3 and the drive device therefor are built in a dynamic semiconductor memory device (not shown).

The drive circuit includes a capacitor 3 having a first terminal 61 and a second terminal 62; a pull-up transistor drive line 51 to be connected to a pull-up transistor drive terminal of the CMOS sense amplifier 3; a pull-down transistor drive line 52 to be connected to a pull-down transistor drive terminal of the CMOS sense amplifier 3; charging switches 71 and 72 which can establish continuity between a power supply line 11 and the first terminal 61 of the capacitor 4 and between a ground line 12 and the second terminal 62 of the capacitor 4, respectively; driving switches 81 and 82 which enable switching between the first terminal 61 of the capacitor 4 and the pull-up transistor drive line 51 and between the second terminal 62 and the pull-down transistor drive line 52, respectively; and restoring switches 91 and 92 which enable switching between the power supply line 11 and the pull-up transistor drive line 51 and between the ground line 12 and the pull-down transistor drive line 52, respectively. It should be noted that the charging switch 71, the driving switch 81, and the restoring switch 91 constitute a first switch circuit 1, and the charging switch 72, the driving switch 82, and the restoring switch 92 constitute a second switch circuit 2.

FIG. 2 illustrates only one CMOS sense amplifier 3 and its drive circuit having the capacitor 4 which are built in a dynamic semiconductor memory device (not shown). However, the dynamic semiconductor memory device may have a plurality of CMOS sense amplifiers 3. In this case, the CMOS sense amplifiers 3 have their respective drive circuits of the above structure. However, the capacitor 4 may be commonly used and discrete pull-up transistor and pull-down transistor drive lines are provided for each sense amplifier, and which may be connected in parallel.

In the circuit constructed as described above, when the CMOS sense amplifier 3 is to be operated, an ON signal is applied by means of charge signal lines 171 and 172 to turn the charging switches 71 and 72 on, an OFF signal is applied by the drive signal lines 181 and 182 and the restore signal lines 191 and 192 to turn both the driving switches 81 and 82 and the restoring switches 91 and 92 off, respectively, and the capacitor 4 is thus charged. After a word line (not shown) is activated and data appears on bit lines 101 and 102 intersected with the word line, an ON signal is applied through the drive signal lines 181 and 182 to the driving switches 81 and 82 to turn the driving switches 81 and 82 on, and an OFF signal is applied through the charge signal lines 171 and 172 and the restore signal lines 191 and 192 to turn both the charging switches 71 and 72 and the restoring switches 91 and 92, respectively, off, and the CMOS sense amplifier 3 is thus driven by the potential difference between the first and second terminals 61 and 62 of the capacitor 4. At this time, because the CMOS sense amplifier 3 is electrically separated from the power supply line 11 and the ground line 12 by the charging switches 71 and 72 and the restoring switches 91 and 92 in an Off-state, the potential of the power supply line 11 and the ground line 12 is not affected and thus does not fluctuate when the CMOS sense amplifier 3 is driven.

Even if a plurality of CMOS sense amplifiers are provided in the memory device and the CMOS sense amplifiers are driven simultaneously by their respective drive circuits, according to the present embodiment, common mode noise does not occur during the drive operation. As a result the reliability of the dynamic semiconductor memory device can be increased to a great extent.

After the drive operation of the CMOS amplifier 3 is completed, an ON signal is applied by the restore signal lines 191 and 192 to turn the restoring switches 91 and 92 on, and an OFF signal is applied by the charge signal lines 171 and 172 and the drive signal lines 181 and 182 to turn the driving switches 81 and 82 off, respectively. As a result, the CMOS sense amplifier 3 is restored and the sense operation is completed.

The period during which the sense amplifier is driven by the capacitor 4 may also be shortened to enable application as an initial sense.

Figure 4:
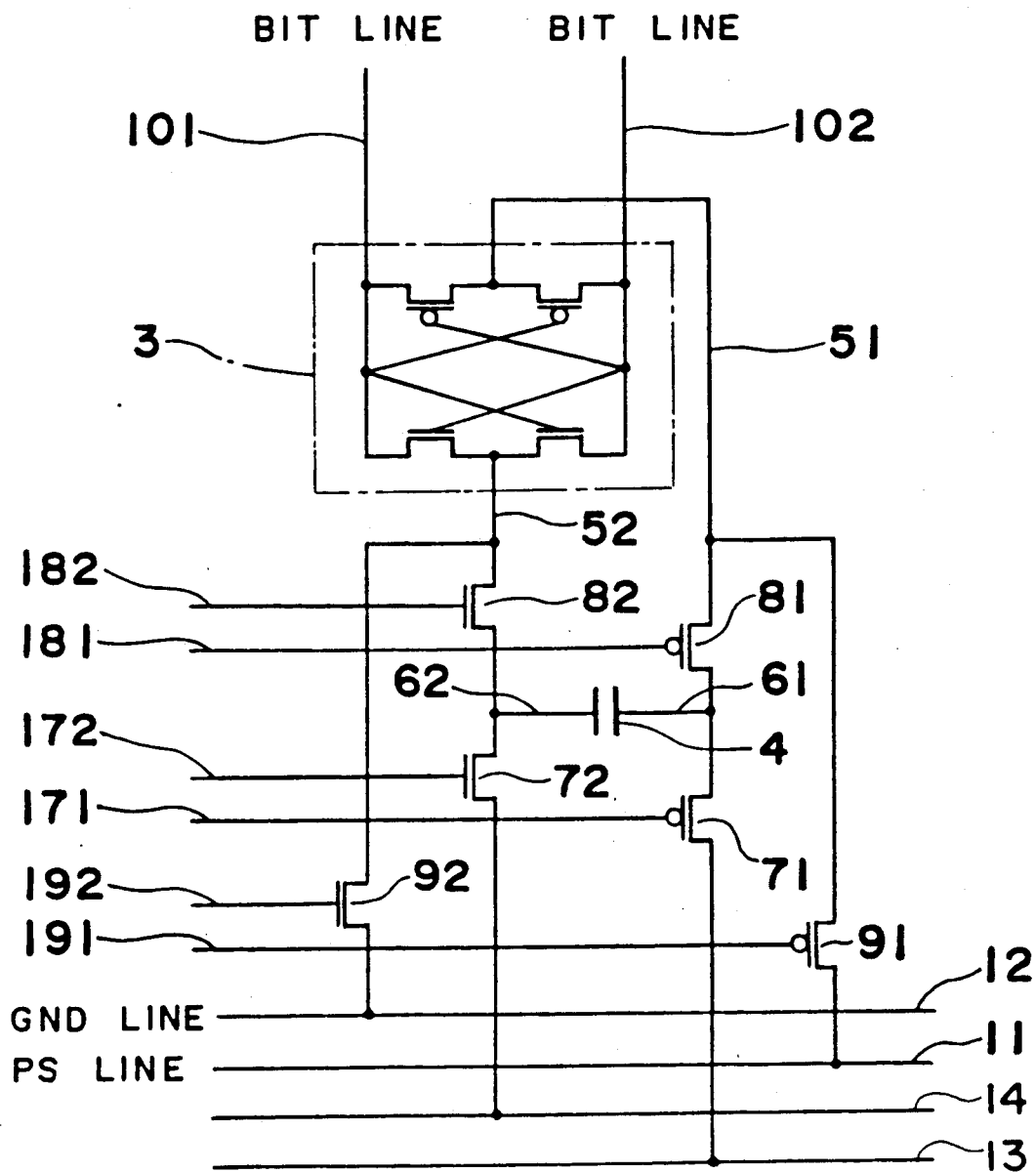
FIG. 4 is a circuit diagram of another embodiment of the present invention.

Furthermore, in the above-described embodiment, the first terminal 61 and the second terminal 62 of the capacitor 4 are charged respectively to the power supply potential and the ground potential, but the first and second terminals 61 and 62 may also be charged to any other suitable high potential and low potential for enabling the CMOS sense amplifier 3 to be driven by the electrical potential difference between the two terminals. FIG. 4 a case illustrates where lines 13 and 14 of any suitable high potential and low potential may be additionally provided to charge the first and second terminals 61 and 62 of the capacitor 41, and the charging switches 71 and 72 may be connected to those lines 13 and 14, respectively, instead of the power supply line 11 and the ground line 12.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A drive device for a CMOS sense amplifier in a dynamic semiconductor memory device, said CMOS sense amplifier having a pull-up transistor, a pull-down transistor, a pull-up transistor drive terminal and a pull-down transistor drive terminal, comprising:

a capacitor having first and second terminals;

a first switch circuit for making a connection between a power supply line, the first terminal of said capacitor and the pull-up transistor drive terminal of the CMOS sense amplifier in response to a first input signal; and a second switch circuit for making a connection between a ground line, the second terminal of said capacitor and the pull-down transistor drive terminal of said CMOS sense amplifier in response to a second input signal;

whereby the CMOS sense amplifier is driven by a potential difference between the first and second terminals of the charged capacitor.

2. The drive device as claimed in claim 1, wherein the first switch circuit comprises a first charging switch connected to a first charging signal for controlling a connection between the power supply line and the first terminal of the capacitor, a first driving switch connected to a first driving signal for controlling a connection between the first terminal of the capacitor and the pull-up transistor terminal and a first restoring switch connected to a first restoring signal for controlling a connection between the power supply line and the pull-up transistor drive terminal, and the second switch circuit comprises a second charging switch connected to a second charging signal for controlling a connection between the ground line and the second terminal of the capacitor, a second driving switch connected to a second driving signal for controlling a connection between the second terminal of the capacitor and the pull-down transistor drive terminal, and a second restoring switch connected to a second restoring signal for controlling a connection between the ground line and the pull-down transistor drive terminal.

3. A drive device for a CMOS sense amplifier in a dynamic semiconductor memory device, said CMOS sense amplifier having a pull-up transistor, a pull-down transistor, a pull-up transistor drive terminal and a pull-down transistor drive terminal, comprising:

a first line having a first predetermined potential of a high level distinct from a potential of a power supply line for the memory device;

a second line having a second predetermined potential of a low level distinct from a potential of a ground line;

a capacitor having first and second terminals charging switch means for controlling a connection between the first line and the first terminal of the capacitor and between the second line and the second terminal of the capacitor, respectively, in response to a charging signal;

driving switch means for controlling a connection between the first terminal of the capacitor and the pull-up transistor drive terminal and between the second terminal of the capacitor and the pull-down transistor drive terminal, respectively, in response to a driving signal; and restoring switch means for controlling a connection between the power supply line and the pull-up transistor drive terminal and between the ground line and the pull-down transistor drive terminal, respectively, in response to a restoring signal whereby the CMOS sense amplifier is driven by a potential difference between the first and second terminals of the charged capacitor when the charging switch means is turned off and the driving switch means is turned on and the restoring switch means is turned off in response to said charging, driving and restoring signals.

* * * * *